(12) United States Patent
Boos

(10) Patent No.: US 6,448,648 B1
(45) Date of Patent: Sep. 10, 2002

(54) METALIZATION OF ELECTRONIC SEMICONDUCTOR DEVICES

(75) Inventor: John Bradley Boos, Springfield, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 730 days.

(21) Appl. No.: 08/826,110

(22) Filed: Mar. 27, 1997

(51) Int. Cl.⁷ .............................................. H01L 23/48
(52) U.S. Cl. ...................... 257/751; 257/750; 257/744; 257/745; 257/769
(58) Field of Search ................................ 257/740–745, 257/750, 751, 768

(56) References Cited

U.S. PATENT DOCUMENTS 5,373,175 A * 12/1994 Ozawa et al. ............... 257/743
5,430,310 A * 7/1995 Shibassaki et al. .......... 257/190

* cited by examiner

Primary Examiner—Steven Loke
Assistant Examiner—Ori Nadav
(74) Attorney, Agent, or Firm—John J. Karasek; George A. Kap

(57) ABSTRACT

An electronic semiconductor device comprising a semiconductor base deposited on a semiconductor substrate by means of molecular beam epitaxy and source, drain and gate disposed on the base in a spaced relationghip to each other, the source and the drain comprising Pd/barrier/Au layers with the palladium layer being in contact with the device. The device is fabricated conventionally except the heat treating is at above about 170° C. for ¼–10 hours sufficient for the palladium layer to react with the base yielding reduced contact and access resistances and a narrower spacing between source and drain.

17 Claims, 3 Drawing Sheets

HEMT DRAIN CHARACTERISTICS. $L_G$ = 0.5 μm, $L_{SD}$ = 1.2 μm, W = 28 μm.

HEAT TREATMENT 175°C FOR 3 HOURS ON HOT PLATE
CONTACT SEPARATION: 0.7 μm
CONTACT RESISTANCE: 0.08 ohm-mm

METALIZATION OF ELECTRONIC SEMICONDUCTOR DEVICES

BACKGROUND OF INVENTION

1. Field of Invention

This invention pertains to metalization of electronic semiconductor devices.

2. Description of Prior Art the AuGe/Ni/Au and AuGe/Au metalization schemes are commonly used in GaAs-based and InP-based devices. Also, the most commonly reported source-drain contacts for AlSb/InAs-based semiconducting materials have been AuGe/Ni/Au or AuGe/Au. However, in such contact schemes for the AlSb/InAs meterials, the contact resistance values are commonly high and the contacts are difficult to adhere. With such schemes, there is significant lateral diffusion into the channel as a result of rapid thermal annealing, which imposes a limit on the minimum HEMT source-drain spacing. Furthermore, scanning electron microscopy revealed that a region of the semiconducting material reacted, as a result of the heat treatment, and extended laterally inwardly from each contact edge.

Semiconducting devices fabricated using the AlSb/InAs-based material systems have potential applications in the fields of high-speed logic and millimeter-wave circuits. AlSb/InAs-based systems have potential for high-speed applications due to the large conduction band discontinuity and attractive transport properties of the InAs channel. Although improvements have been made in recent years, the material growth and fabrication technology for AlSb/InAs devices is relatively immature. The reduction of the source and drain access resistance in semiconducting electronic devices, such as HEMTs, is an area where improvement is needed. Low access resistance is required to reduce the parasitic delays which can significantly mask the intrinsic speed in high-speed electronic devices, such as HFETs. The AlSb/InAs material system is particularly suitable for achieving low access resistance due to the high mobility, high sheet charge density, and low contact resistance values which are obtained.

Pd/Ge-based metalization have been used for ohmic contacts to GaAs-based and InP-based materials. These contacts are shallow, thermally stable, and able to provide low contact resistance via solid state reaction using a relatively low heat treatment.

In AlSb/InAs materials, Pd/Ge/Au contact schemes resulted in significant lateral diffusion into the channels when the sample was heat treated on a hot plate at a relatively low temperature. This deleterious lateral diffusion is a considerable drawback which limits usefulness of the Pd/Ge-type contact for AlSb/InAs-based heterostructures.

SUMMARY OF INVENTION

An object of this invention is a metallized semiconductor device containing metallic contacts of low contact resistance compared to prior art.

Another object of this invention is a process for forming a metallized semiconductor electronic device using a low temperature heat treatment which avoids material deterioration.

These and other objects of this invention are accomplished by a metallized semiconductor electronic device, such as an AlSb/InAs-based HFET, which has ohmic contact Pd/barrier/Au bonded to the device with contact resistance of less than 0.2 ohm-mm, access resistance of less than 0.5 ohm-mm, and a spacing between source and drain of less than 1 micron.

DESCRIPTION OF PREFERRED EMBODIMENTS

Figure 1:
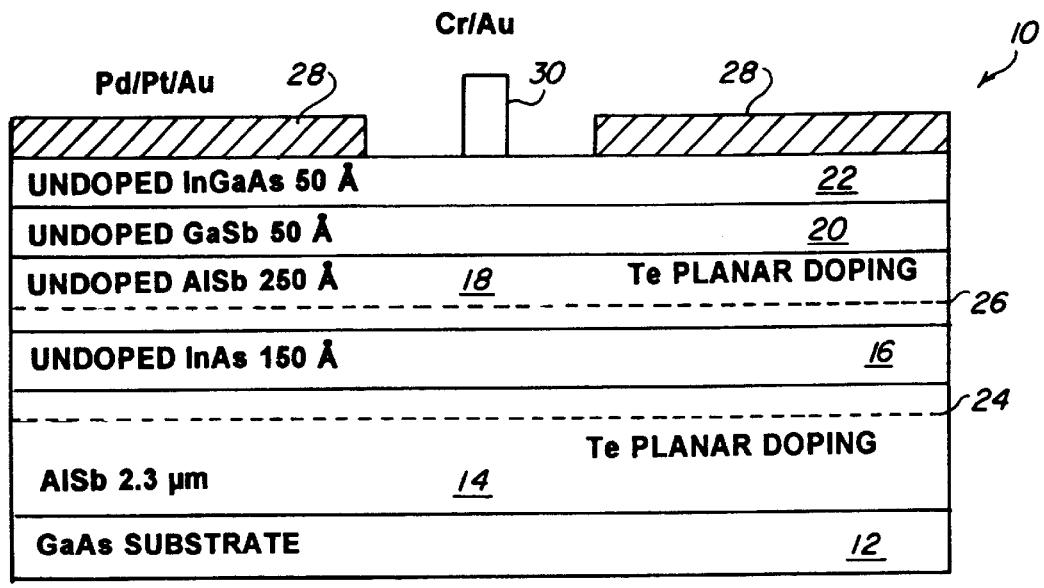
FIG. 1 is a cross-sectional view of the HEMT of Example 1.

In this disclosure, the design and fabrication of a new metallization scheme for semiconductor devices is described which reduces the extend of the lateral diffusion, increases the control over the time-temperature process window, and minimizes thermal stress effects. The contact metalization retains the low temperature reactivity of palladium but uses a diffusion barrier to prevent the gold from reacting with the semiconductor material. The metalization scheme is formed using a relatively low temperature heat treatment and has resulted in low contact resistance, low lateral diffusion, excellent morphology, and excellent edge definition.

The device contemplated herein is any electronic semiconductor device which has an ohmic contact. Such a device is basically composed of a semiconductor base composed of one or more semiconductor materials, an electron conducting region in or constituting the base, and an ohmic contact of palladium layer, a barrier layer, and a gold layer on top. The palladium layer is in contact with the base. In a preferred embodiment, the device can be a bi-polar transistor, a field effect transistor, or a diode.

The invention disclosed herein is directed to a metallized semiconductor device and a process for its preparation. More specifically, this invention is directed to a metallized AlSb/InAs semiconductor device having at least one Pd/barrier/Au ohmic contact bonded thereto characterized by low contact and access resistances which device is prepared using a low temperature heat treatment which avoids material degradation.

The contact should be thick enough to provide a low contact resistance between it and the article.

The base of the device is made of any one, two or more semiconductors that degrade typically at above 200° C., more typically above 300° C. Suitable semiconductor materials are selected from Group III–V semiconductor elements such as indium, aluminum, gallium, arsenic, antimony, phosphorus, and the like. Sb-based semiconductors for device applications are also suitable herein particularly for their unique electronic and optoelectronic properties. This includes the use of wide and narrow band gap materials. Examples of wide ban gap materials include InPsb, AlPSb, and AlGaSbAs. Examples of narrow band gap materials include GaSb and InSb. Of special interest herein is a semiconductor device wherein the barrier layer is AlSb and the channel layer in InAs. The semiconductor materials can be deposited on a suitable substrate by molecular beam epitaxy in a conventional manner.

The contact should be thick enough to provide a low contact resistance between it and the article and should have reduced lateral diffusion resulting in a low access resistance.

The contact that is provided on the semiconductor device contains palladium layer in contact with the device, barrier layer above the palladium layer, and a gold layer above the barrier layer. The palladium layer is chemically reactive with the semiconductor device to facilitate low contact resistance between the contact and the article. The gold layer is a highly electrically conducting material that also possess the ease of bonding. The function of the barrier layer is to act as a barrier to gold atoms and to prevent diffusion thereof into the channel semiconductor device, especially the lateral diffusion in an HFET between source and drain underneath the gate.

The palladium layer is typically 10Å–1000Å, more typically 50Å–500Å in thickness before heat treatment, although after heat treatment, this thickness is essentially depleted when palladium reacts with and diffuses into the semiconducting material of the device to form a ohmic contact of low contact resistance.

The barrier layer can be platinum, titanium, titanium tungsten, platinum silicide, titanium carbide, tungsten carbide, or any other suitable material that can inhibit diffusion of gold therethrough at operating conditions. Preferred barrier material for a AlSb/InAs-type heterostructures is platinum. Typically, thickness of the barrier layer is 50Å–1000Å, more typically 100Å–500Å before heat treatment.

The low-resistance gold layer is typically 100Å–5000Å, more typically 200Å–2000Å in thickness before heat treatment, if deposited by a process such as e-beam evaporation. If the gold layer is deposited in another manner, such as by electroplating, then its thickness can be in the micron range.

The use of a barrier layer to deter lateral diffusion of gold is critical. In absence of a barrier, gold-based contacts allow lateral gold diffusion which adversely affects reproducibility since lateral gold migration cannot be controlled, predicted, or rendered uniform. Lateral gold diffusion is also deleterious since it facilitates poor quality or leaky gates.

There is another reason why lateral gold diffusion should be avoided. It appears that if lateral gold diffusion is overcome, the spacing between source and drain can be significantly narrowed in certain applications. On the basis of this invention, the spacing can be reduced to less than about 2 microns, such as 0.5–1.5 microns, preferably less than about 0.5 micron. It appears possible to reduce the spacing down to about 0.1 micron.

The process for making the semiconductor device is conventional except for the heat treatment step which is conducted at a lower temperature in a non-oxidizing atmosphere. The process includes the steps of depositing the semiconducting layer or layers on a substrate, as by means of molecular beam epitaxy. The contact patterns are defined using a resist and UV lithography. The metallic layers of the contact are deposited on the article by e-beam evaporation. If this invention is used to make an HFET, the gate can be formed with multi-level resist e-beam lithography following the heat treatment step. Device isolation can be achieved by etching and a gate air bridge can be formed at the mesa-edge to reduce leakage current.

The heat treating step is undertaken after formation of the contact and typically before gate formation, to avoid thermal deterioration of the gate material. The heat treating step is conducted at as low a temperature and as short a time as possible which facilitates reaction between palladium and the semiconductor material of the device. The temperature of the heat treating step is typically about above 150° C., and its duration is in excess of a few seconds, and more typically, the temperature is above about 170° C. and its duration if ¼–10 hours. Since temperature and duration are inversely proportional in this situation, the heat treating step can be carried out at a higher temperature but shorter duration, making sure that the heat treating temperature does not thermally degrade the device.

The design and fabrication process of the Pd/barrier/Au metallization or contact scheme for a semiconductor electronic device, particularly an AlSb/InAs heterostructure disclosed herein, reduces contact and access resistances, reduces the extent of lateral gold diffusion, increases the control over the time-temperature process window, and minimizes thermal stress effects. The contact disclosed herein retains the low temperature reaction of palladium but uses a barrier layer to prevent gold from reacting with the semiconductor material.

The Pd/barrier/Au metalization scheme is formed using a relatively low temperature heat treatment and has resulted in low contact resistance, low lateral gold diffusion, excellent morphology, and excellent edge definition. With this contact, AlSb/InAs-based electronic devices, such as HFETs, have been fabricated which have the lowest contact resistance and lowest access resistance. The access resistance is comparable to the lowest known for any HEMT.

In AlSb/InAs-based electronic devices, contact resistance is below about 0.5 ohm-mm, preferably 0.1–0.5 ohm-mm and access resistance is below about 1.2 ohm-mm, preferably 0.2–1 ohm-mm.

Due to the relatively low temperature heat treatment required using the Pd/barrier/Au contact of this invention, the semiconductor material is not affected by thermal stress effects which may occur at higher temperatures. The AlSb/InAs material system is particularly susceptible to thermal stress effects since the material is grown metamorphically on a GaAs substrate, which is not lattice-matched to the AiSb/InAs material. As a result of growth on a severely mismatched substrate, a threading dislocation density of $10^6$–$10^7/cm^2$ in the material exists, which makes the material more susceptible to thermal stress effects.

For semiconductor electronic devices, such as HEMTs, fabricated with the contacts of this invention, the resulting gate diode leakage currents are lower and the channel sheet resistances obtained after processing reveal very negligible change as a result of the heat treatment.

There are four key features to the contact metallization and the fabrication process disclosed herein:

(1) The use of a thin palladium layer which is capable of forming a low resistance contact and which has a low diffusion constant so that the lateral diffusion is minimized;

(2) The use of the diffusion barrier to prevent gold from reacting with the semiconductor material of the device and thereby avoid the excessive lateral diffusion of gold into the channel, which would otherwise occur in the absence of the barrier;

(3) The formation of a metallic contact which has excellent surface morphology and edge definition which enables registration of the subsequent lithography performed with high resolution in the fabrication of certain heterostructures; and (4) The use of a low temperature heat treatment which minimizes thermal stress effects and thus maintains high quality of the grown material resulting in low gate current leakage and high FET performance.

Having described the invention, the following examples are given as particular embodiments thereof and to demonstrate the practice and advantages thereof. It is understood that the examples are given by way of illustration and are not intended to limit the specification or the claims in any manner.

EXAMPLE 1

This example demonstrates certain advantages realized in conjunction with a AlSb/InAs-based HEMT provided with a contact of Pd/Pt/Au which was heat treated at 175° C. before provision of the gate.

Pursuant to the disclosure herein, layers of AlSb/InAs 10 were grown my molecular beam epitaxy at 510° C. on an updoped (100) GaAs substrate 12 that was about 400 microns thick. The material layer composition and thickness of the HEMT fabricated using the Pd/Pt/Au ohmic contact metalization scheme is shown in FIG. 1. The 2.3 micron updoped AlSb buffer layer 14, disposed on substrate 12, was used to accommodate the 7% lattice mismatch. Undoped InAs channel or quantum well 16, disposed on layer 14, was 150Å thick; another undoped AlSb layer 18, disposed on layer 16, was 250Å thick; undoped GaSb layer 20, disposed on layer 18, was 50Å thick; and undoped InGaAs layer 22, disposed on layer 20 was also 50Å thick. The electron carriers were supplied by the two Te planar doping sheets 24, 26 which were provided by molecular beam epitaxy 50Å above and 50Å below the InAs channel within the underlying AlSb layer 14 and within the overlying AlSb layer 18. The Te planar sheets were each about 5Å thick. The double heterostructure material exhibited a 300K mobility of 16,200cm$^2$/V-sec and a sheet charge of 2.2×10$^{12}$/cm$^2$. The channel served as an electron conducting region.

The contact patterns 28 were defined using PMMA-based resist and deep UV lithography. The Pd/Pt/Au (100Å/200Å/600Å) layers were deposited by e-beam evaporation and heat treated at 175° C. using a hot plate which was located within a glove box containing a non-oxidizing, essentially inert atmosphere of H$_2$:N$_2$ in volume proportion of 5%:95%. The sample was heat treated for 3 hours to ensure sufficient reaction of palladium which was in contact with the semiconductor device. The Schottky-gate contact 30 was Cr/Au and was formed after heat treatment and cooling to ambient temperature using tri-level resist e-beam lithography. Device isolation was achieved by wet chemical etching, and a gate air bridge was formed at the mesa edge to reduce leakage current at the gate.

Figure 2:
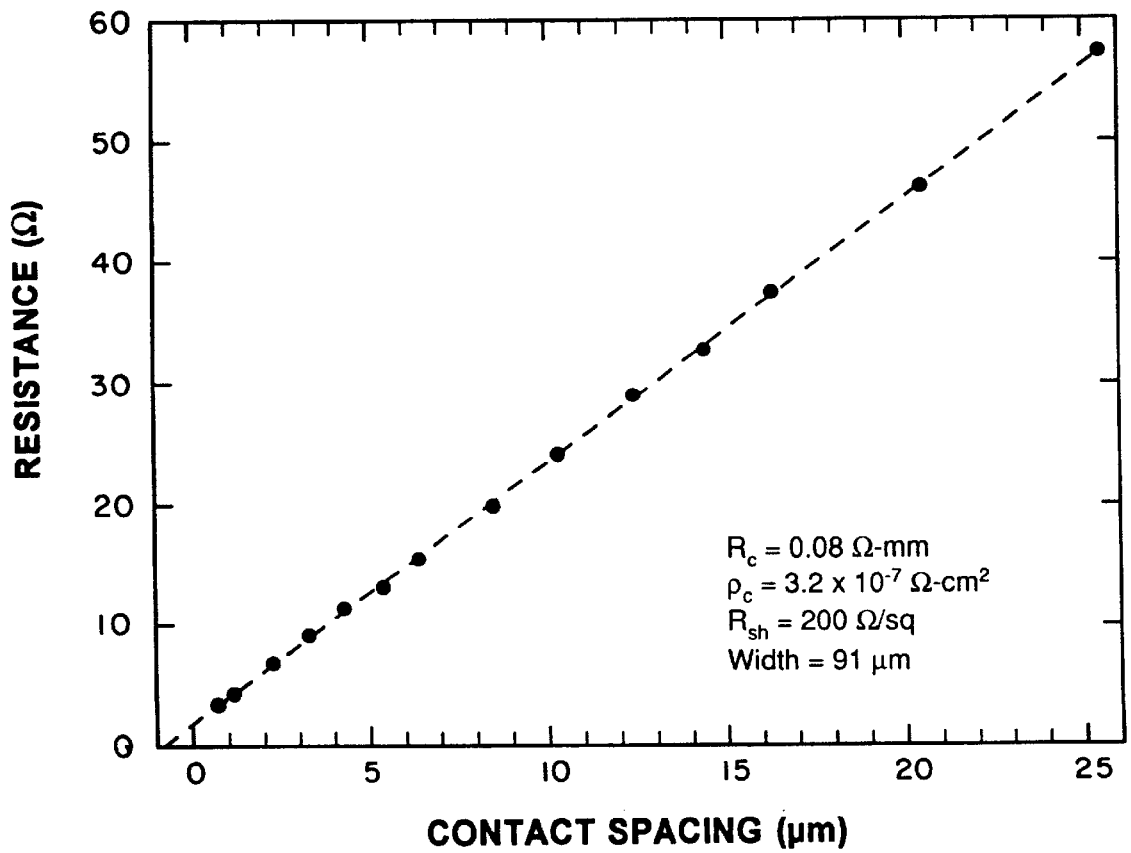
FIG. 2 is a graph of four-probe transmission line model measurement for the AlSb/InAs HEMT of Example 1.

The contact resistance was evaluated using conventional four-probe transmission line model (TLM) measurements. A typical TLM measurement is shown in FIG. 2. At zero contact spacing, on the basis of FIG. 2, the contact resistance of this HEMT was about 0.1 ohm-mm.

Figure 3:
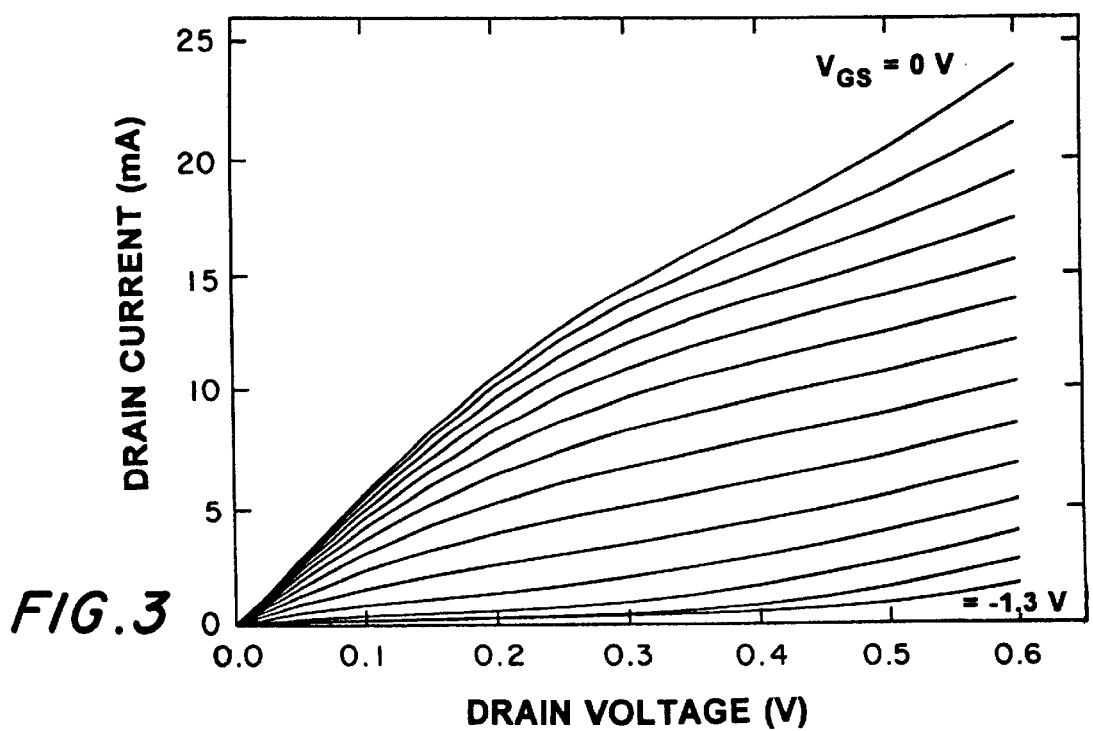
FIG. 3 is a graph of the HEMT drain characteristics using Pd/Pt/Au metalization, described in Example 1.

The HEMT drain characteristics obtained using the Pd/Pt/Au contact are shown in FIG. 3. The gate length was 0.5 micron, gate width was 28 microns, and the source to drain spacing was 1.2 microns. The HEMT exhibited a low field source-drain resistance (Ra) of 0.47 ohm-mm at $V_{GS}$ of zero volts or the slope.

On the basis of scanning electron microscopy, no reaction with the semiconductor base of the HEMT was observed in the region adjacent to the contacts as a result of the heat treatment.

The HEMT also exhibited a large output conductance at high drain voltages, which is believed to be a result of trapping effects due to the additional bottom donor layer (identify).

The microwave performance of the HEMT was also found to be limited by gate leakage current associated with holes generated by impact ionization.

Figure 5:
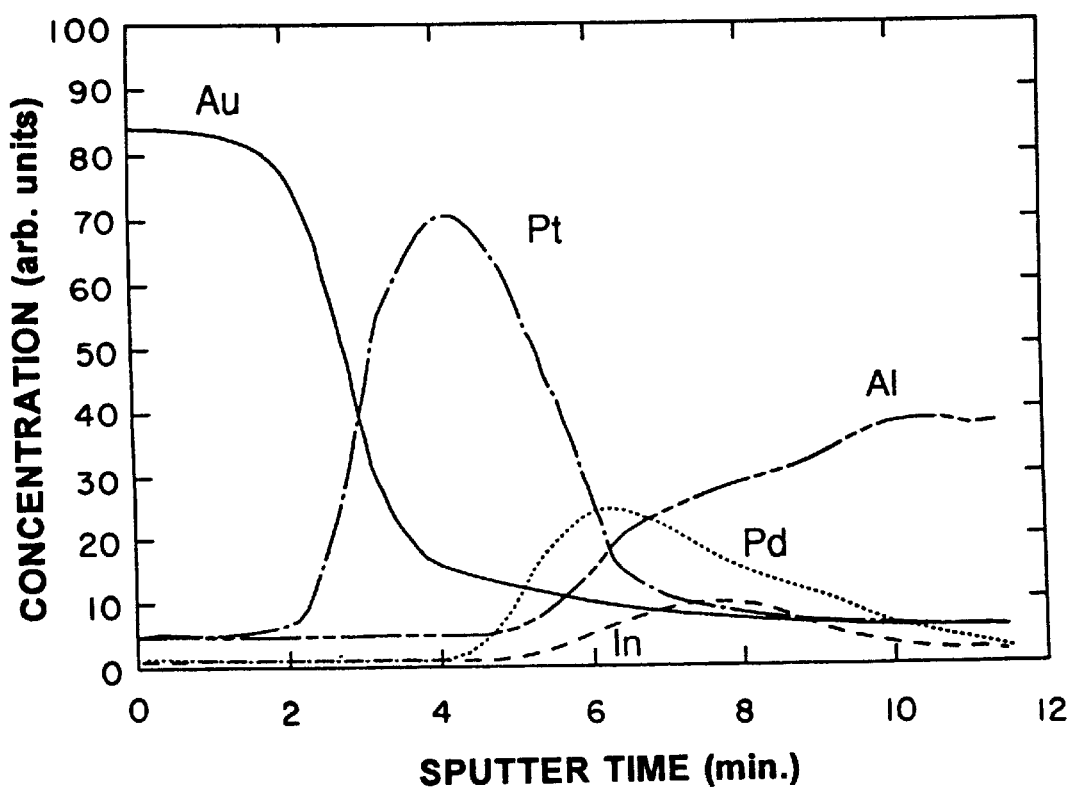
FIG. 5 is a graph of Auger depth profiling of the metalization Pd/Pt/Au on the HEMT of Example 1.

Auger depth profiling revealed that palladium from the contact diffused to a depth slightly beyond the InAs channel layer, as shown in FIG. 5. It is also apparent from FIG. 5 that the platinum barrier layer in the contact was an effective diffusion barrier which prevented gold in the contact from reacting with the semiconducting material. Since the As profile closely followed the In profile, and the Sb profile closely followed the Al profile, these profiles were omitted from FIG. 5 for the sake of clarity.

Figure 4:
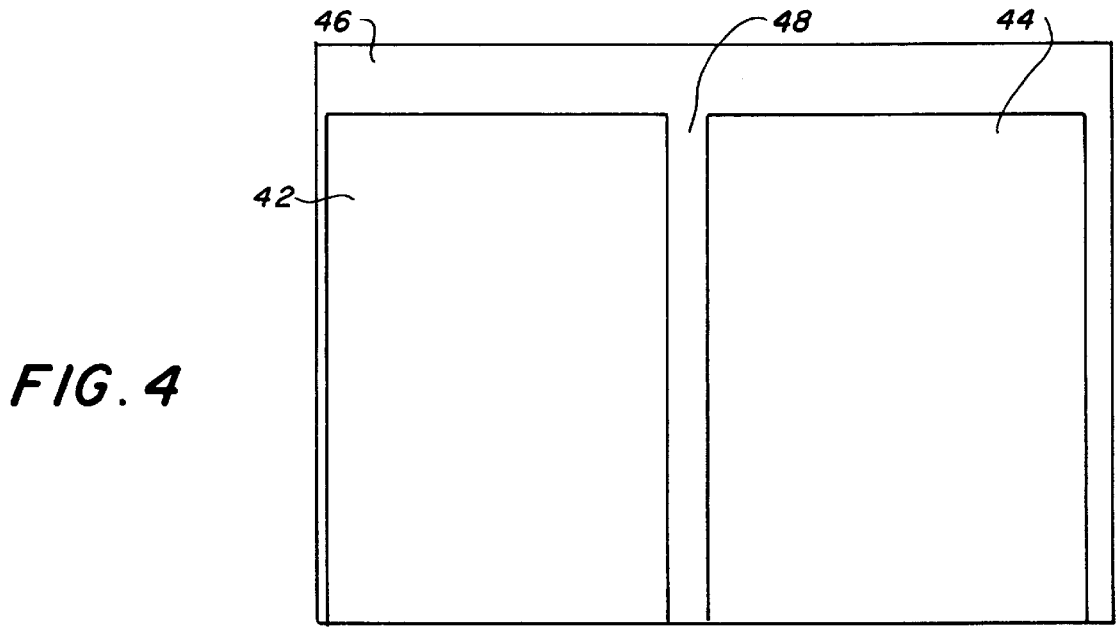
FIG. 4 is a top view of the HEMT of Example 1 without a gate after heat treatment at 175° C. for 3 hours at magnification of 0.7 inch=2 microns.

The HEMT produced had excellent morphology and edge definition. FIG. 4, which is a top view of FIG. 1 devoid of the gate, shows source 42 and drain 44 disposed on the top surface 46 of the HEMP with spacing 48 between the source and the drain.

EXAMPLE 2

This example is similar to Ex. 1 except that the contact was Pd/Au (100Å/600Å) and the heat treating step was carried out at 175° C. for 5 hours.

Without the platinum diffusion barrier layer, the gold of the Pd/Au contact exhibited significant lateral diffusion into the channel as a result of the heat treatment at 175° C. for 5 hours.

EXAMPLE 3

This example is similar to Ex. 1 except that the heat treatment was carried out in one instance at 175° C. for 5 hours and in another instance it was carried out at 250° C. for 19 hours.

When the heat treatment was carried out at 175° C. for 5 hours, the contact resistance was 0.1 ohm-mm whereas when the heat treatment was at 250° C. for 19 hours, no significant change in the contact resistance or the sheet resistance was observed. On the basis of scanning electron microscopy, no reaction was observed in the region adjacent to the contact as a result of the heat treatment at 250° C. for 19 hours.

While presently preferred embodiments have been shown of the invention disclosed herein, persons skilled in this art will readily appreciate that various additional changes and modifications may be made without departing from the spirit of the invention as defined and differentiated by the following claims.

What is claimed is:

1. A semiconductor electronic device comprising a simiconductor base; an electron conducting region disposed in or constituting said base; and an ohmic contact disposed on said base, said ohmic contact comprises Pd/barrier/Au layers, with said palladium layer being in contact with said base.

2. The device of claim 1 wherein thickness of said palladium layer is 10–1000Å, thickness of said barrier layer is 50–1000Å, and thickness of said gold layer is 100–5000Å.

3. The device of claim 1 wherein thickness of said palladium layer is 50–500Å, thickness of said barrier layer is 100–500Å, and thickness of said gold layer is 200–2000Å.

4. The device of claim 3 wherein said barrier layer is selected from the group consisting of platinum, titanium, titanium tungsten, platinum silicide, titanium carbide, titanium silicide, and mixtures thereof.

5. The device of claim 2 wherein said base comprises semiconductors selected from the group consisting of Group III–V elements of the Periodic Table.

6. The device of claim 5 wherein said base includes an AlSb barrier and an InAs channel, resistance between said contact and said base is 0.01–0.5 ohm-mm at 0 $V_{GS}$.

7. A semiconductor electronic device comprising a semiconductor base; an electron conducting region disposed in or constituting said base; and a source and a drain disposed on said base in spaced relationship, said source and said drain comprising Pd/barrier/Au layers, with said palladium layer being in contact with said base.

8. The device of claim 7 wherein thickness of said palladium layer is 10–1000Å, thickness of said gold barrier layer is 50–1000Å, and thickness of said gold layer is 100–5000Å, and spacing between said source and said drain is up to about 2 microns.

9. The device of claim 7 wherein thickness of said palladium layer is 50–500Å, thickness of said barrier layer is 100–500Å, and thickness of said gold layer is 200–2000Å.

10. The device of claim 9 wherein said barrier layer is selected from the group consisting of platinum, titanium, titanium tungsten, platinum silicide, titanium carbide, titanium silicide, and mixtures thereof.

11. The device of claim 8 wherein said base comprises semiconductors selected from the group consisting of group III–V elements of the Periodic Table.

12. The device of claim 9 wherein said base includes an AlSb buffer layer, InAs layer on said AlSb buffer layer, another AlSb layer on said InAs layer, GaSb layer on said another AlSb layer, InGaAs layer on said GaSb layer and in contact with palladium, a Te layer in the upper portion of said AlSb buffer layer, and another Te layer in the lower portion of said another AlSb layer.

13. A semiconductor electronic device comprising a semiconductor base; a channel disposed in said base; a source and a drain disposed on said base in spaced relationship, said source and said drain comprise Pd/barrier/Au layers, with said palladium layer being in contact with said base; and a gate disposed on said base and spaced between said source and drain in spaced relationship thereto.

14. The device of claim 13 wherein thickness of said palladium layer is 10–1000Å, thickness of said gold barrier layer is 50–1000Å, and thickness of said gold layer is 100–5000Å; and spacing between said source and said drain is up to about 2 microns.

15. The device of claim 13 wherein thickness of said palladium layer is 50–500Å, thickness of said gold barrier layer is 100–500Å, and thickness of said gold layer is 200–2000Å; and spacing between said source and drain is 0.5–1.5 microns.

16. The device of claim 15 wherein said gold barrier layer is selected from the group consisting of platinum, titanium, titanium tungsten, platinum silicide, titanium carbide, titanium silicide, and mixtures thereof.

17. The device of claim 15 wherein said base includes an AlSb barrier and an InAs channel.

* * * * *